(12) United States Patent
Forbes et al.

(10) Patent No.: US 6,294,813 B1
(45) Date of Patent: Sep. 25, 2001

(54) INFORMATION HANDLING SYSTEM HAVING IMPROVED FLOATING GATE TUNNELING DEVICES

(75) Inventors: Leonard Forbes, Corvallis, OR (US); Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/504,496

(22) Filed: Feb. 15, 2000

Related U.S. Application Data

(62) Division of application No. 09/087,473, filed on May 29, 1998, now Pat. No. 6,025,627.

(51) Int. Cl.$^7$ ................................................. H01L 29/788
(52) U.S. Cl. ....................... 257/321; 257/315; 257/317; 365/185.28
(58) Field of Search .................................. 257/315, 317, 257/321, 322; 438/211, 257; 365/185.26, 185.28

(56) References Cited

U.S. PATENT DOCUMENTS

| | | | |
|---|---|---|---|
| 4,486,769 | * 12/1984 | Simko | 257/317 |
| 4,757,360 | 7/1988 | Faraone et al. | 257/317 |
| 4,947,221 | 8/1990 | Stewart et al. | 257/316 |
| 5,089,867 | * 2/1992 | Lee | 257/316 |
| 5,278,087 | * 1/1994 | Jenq | 438/594 |
| 5,304,505 | * 4/1994 | Hazani | 438/264 |
| 5,429,966 | 7/1995 | Wu et al. | 438/594 |
| 5,502,668 | * 3/1996 | Shimoji et al. | 365/185.28 |
| 5,544,103 | * 8/1996 | Lambertson | 365/185.15 |
| 5,631,482 | * 5/1997 | Hong | 257/326 |
| 5,888,870 | * 3/1999 | Gardner et al. | 438/261 |
| 5,963,480 | * 10/1999 | Harari | 365/185.29 |
| 6,043,124 | * 3/2000 | Wu | 438/260 |

OTHER PUBLICATIONS

Fong, Y., et al., "Oxides Grown on Textured Single–Crystal Silicon–Dependence on Process and Application in EEPROMs", *IEEE Transactions on Electron Devices*, 37(3), pp. 583–590, (Mar. 1990).

Gasser, W., et al., "Quasi–monolayer Deposition of Silicon Dioxide", *This Solid Films* (250), pp. 213–218, (1994).

Geusic, J., et al., "Structured Silicon Surfaces and Tunnel Oxides for Flash Memory Devices", *Micron Disclosure*, (Sep. 25, 1997).

Hao, M.Y., et al., "Electrical Characteristics of Oxynitrides Grown on Textured Single–Crystal Silicon", *Appl. Phys. Lett.*, 60, 445–447, (Jan. 1992).

Klaus, et al., "Atomic Layer Controlled Growth of SiO2 Films Using Binary Reaction Sequence Chemistry", *Applied Physics Lett.* 70 (9), 1092–94, (Mar. 3, 1997).

(List continued on next page.)

Primary Examiner—Eddie Lee
Assistant Examiner—George C. Eckert, II
(74) Attorney, Agent, or Firm—Schwegman, Lundberg, Woessner & Kluth, P.A.

(57) ABSTRACT

A method and structure for textured surfaces in non volatile floating gate tunneling oxide (FLOTOX) devices, e.g. FLOTOX transistors, are provided. The present invention capitalizes on using "self-structured masks" and a controlled etch to form nanometer scale microtip arrays to form the textured surfaces. The present invention further employs atomic layer epitaxy (ALE) to create a very conformal tunnel oxide layer which complements the nanometer scale microtip arrays. The resulting structure provides a higher tunneling current than currently exists in FLOTOX technology. The improved tunneling currents at low voltages can make these FLOTOX devices suitable for replacing DRAMS.

17 Claims, 6 Drawing Sheets

OTHER PUBLICATIONS

Ott, A.W., et al., "Al303 Thin Film Growth on Si (100) Using Binary Reaction Sequence Chemistry", *Thin Solid Films,* vol. 292, 135–44, (1997).

Suntola, T., "Atomic Layer Epitaxy", *Handbook of Crystal Growth 3, Thin Films of Epitaxy, Part B: Growth Mechanics and Dynamics,* Elsevier, Amsterdam, 601–63, (1994).

Wang, P.W., et al., "Excellent Emission Characteristics of Tunneling Oxides Formed Using Ultrathin Silicon Films for Flash Memory Devices", *Japanese Journal of Applied Physics,* 35, 3369–3373, (Jun. 1996).

Anderson et al., Evidence for Surface Asperity Mechanism of Conductivity in Oxide Grown on Polycrystalline Silicon, J. of App. Phys., Vo. 48, Iss. 11, pp. 4834–4836 (abstract only provided), Nov. 1977.*

\* cited by examiner

INFORMATION HANDLING SYSTEM HAVING IMPROVED FLOATING GATE TUNNELING DEVICES

This application is a Divisional of U.S. Ser. No. 09/087,473, filed May 29, 1998 now U.S. Pat. No. 6,025,627.

FIELD OF THE INVENTION

The present invention relates generally to semiconductor integrated circuits. More particularly, it pertains to an alternate method and structure for improved floating gate tunneling devices.

BACKGROUND OF THE INVENTION

Modern integrated circuit technology relies on transistors to formulate vast arrays of functional circuits. The complexity of these circuits requires the use of an ever increasing number of linked transistors. As the number of transistors required increases, the surface area that can be dedicated to a single transistor dwindles. Today, also, low voltages are desired for low power, portable, battery operated circuits and systems. Thus, it is desirable to construct integrated circuit components which can operate at low voltage levels and accommodate higher density arrangement on the surface of the silicon chip.

Non volatile floating gate tunneling oxide (FLOTOX) devices, e.g. FLOTOX transistors, offer the prospect of very high density structures. Flash memories are one form of FLOTOX devices and electronically erasable and programmable read only memories (EEPROMs) are another. Due to their high density nature, memories formed with FLOTOX transistors have the potential of replacing hard storage disk drives in computer systems. The advantages to this substitution would be in replacing a complex and delicate mechanical system with a rugged and easily portable small solid-state non-volatile memory system. There is also the possibility that given more speed of operation, particularly in the erase operation, that FLOTOX transistors might be used to replace dynamic random access memories (DRAMs). Thus, FLOTOX transistors might eventually have the ability to fill all memory needs in future computer systems.

In operation, FLOTOX transistors can be electronically programmed, erased, and reprogrammed. In FLOTOX transistors a floating gate is electrically isolated and any charge stored on the floating gate is trapped. Storing sufficient charge on the floating gate will create an inversion channel between source and drain of the transistor. Thus, the presence or absence of charge on the floating gate represents two distinct data states.

Typically, FLOTOX transistors are selectively programmed, or "written to," by hot electron injection which places a charge on a floating gate during a write. The FLOTOX transistors are selectively erased by Fowler-Nordheim tunneling which removes the a charge from the floating gate. During a write, a high programming voltage is placed on a control gate. This forces an inversion region to form in the p-type substrate. The drain voltage is increased to approximately half the control gate voltage while the source is grounded, increasing the voltage drop between the drain and source. In the presence of the inversion region, the current between the drain and source increases. The resulting high electron flow from source to drain increases the kinetic energy of the electrons. This causes the electrons to gain enough energy to overcome the outside barrier and collect on the floating gate.

After the write is completed, the negative charge on the floating gate raises the transistor's threshold voltage ($V_T$) above the wordline logic 1 voltage. When a written transistor's wordline is brought to a logic 1 during a read, the transistors will not turn on. Sense amplifiers detect and amplify the transistor current, and output a 0 for a written transistor.

The floating gate can be unprogrammed, or "erased," by grounding the control gate and raising the source voltage to a sufficiently high positive voltage to transfer electrons out of the floating gate to the source terminal of the transistor by tunneling through the insulating gate oxide. After the erase is completed, the lack of charge on the floating gate lowers the cell's $V_T$ below the wordline logic 1 voltage. Thus when an erased cell's wordline is brought to a logic 1 during a read, the transistor will turn on and conduct more current than a written cell. Some flash devices use Fowler-Nordheim tunneling for write as well as erase.

One of the present hurdles to FLOTOX transistors replacing DRAMs concerns the Fowler-Nordheim (FN) erase operation. Fowler-Nordheim tunneling requires high voltages, is relatively slow, and introduces erratic over erase and other reliability problems due to the very high erase voltages used. These very high erase voltages are a fundamental problem arising from the high electron affinity of bulk silicon or large grain polysilicon particles used as the floating gate. The high electron affinity creates a very high tunneling barrier and, even with high negative voltages applied to the gate, a large tunneling distance. The high tunneling barrier and large tunneling distance equate to a very low tunneling probability for electrons attempting to leave the floating gate. This results in long write times since the net flux of electrons leaving the floating gate is low or the tunneling current discharging from the floating gate is low.

One method for FLOTOX transistors to overcome the high erase voltages and attain DRAM level operation voltages is through the use of textured or micro-roughened surfaces. Efforts have demonstrated that producing a textured surface at the substrate/tunnel oxide ($Si/SiO_2$) interface increases the electric fields between the floating gate and the substrate. The higher electric field in turn produces higher tunneling currents at lower voltages. Previous work has achieved a textured surface formed as a dense array of microtips (i.e. $10^8/cm^2$). The textured surfaces result in higher tunneling currents at lower voltages. However, these techniques require oxidation to form the insulating gate oxide after the texturing has been completed. This process is self defeating in that it tends to smooth the surface and remove the textured features.

Thus, what is needed is an improved method and structure for producing FLOTOX transistors which have high tunneling currents at low voltages. It is further desirable to attain these results with a device which satisfies the industry wide demand for high density devices.

For the reasons stated above, and for other reasons stated below which will become apparent to those skilled in the art upon reading and understanding the present specification, it is desirable to develop an improved method and structure for FLOTOX transistors.

SUMMARY OF THE INVENTION

The above mentioned problems with non volatile FLOTOX transistors and other problems are addressed by the present invention and will be understood by reading and studying the following specification. A method and structure are provided which create an improved textured surface and improved insulating gate oxide in order to increase low voltage tunneling currents in FLOTOX transistors.

In particular, an illustrative embodiment of the present invention includes a non volatile memory cell structure. The non volatile memory cell structure includes a substrate with a textured surface. The textured surface includes an array of microtips with each microtip having a top surface. The microtips in the array have an average density of $10^{12}/cm^2$. A tunnel oxide layer is adjacent to the textured substrate. The tunnel oxide layer is deposited using binary reaction sequence chemistry. A first gate is formed on the tunnel oxide layer. An insulator layer formed on the first gate. The structure further includes a second gate formed on the insulator layer.

In another embodiment, a non volatile memory cell structure is provided. The structure includes a first interface which has spaced source and drain regions and a body region located between the source and drain on a first portion of the interface. The first interface has a silicon (Si) layer adjacent to a silicon dioxide ($SiO_2$) layer. The silicon dioxide ($SiO_2$) layer has a thickness between 15 and 100 Angstroms (Å). The silicon dioxide ($SiO_2$) layer is deposited using binary reaction sequence chemistry. A second interface is adjacent to the first interface. A third interface is adjacent to the second interface. And, a fourth interface is adjacent to the third interface.

In another embodiment, a memory array of non volatile memory cell structures is provided. The memory array includes a number of floating gate tunneling oxide (FLOTOX) transistors. Each FLOTOX transistor further includes a substrate that has a first source/drain region, a second source/drain region, and a body region. The substrate has a textured surface which comprises an array of microtips. Each microtip has a top surface. The microtips in the array of microtips have an average density of $10^{12}/cm^2$. A tunnel oxide layer is formed on the substrate. The tunnel oxide layer is deposited using atomic layer epitaxy (ALE). A first conductive layer is formed on the tunnel dielectric. An insulator layer is formed on the first conductive layer. And, a second conductive layer is formed on the insulator layer. The memory array further includes a number of wordlines. Each wordline couples the second conductive layer for a number of FLOTOX transistors. A number of bitlines are included such that each bitline couples the second source/drain region for a number of FLOTOX transistors. A number of sense amplifiers are included. The number of sense amplifiers couple to a select number of the number of bitlines. Also, a number of sourcelines are provided. Each sourceline couples a first source/drain region for a number of FLOTOX transistors.

Another embodiment of the present invention includes an information handling system. The information handling system includes a memory array and a central processing unit (CPU) coupled together by a system bus. The memory array includes the memory array of non volatile memory cell structures described above.

In another embodiment of the present invention, a method for fabricating a non volatile memory cell structure is provided. The method includes forming a textured surface on a substrate. Forming the textured surface includes forming an array of microtips so that each microtip has a top surface. Forming the array of microtips includes forming the microtips in the array of microtips to have an average density of $10^{12}/cm^2$. A tunnel oxide layer is formed on the textured surface. Forming the tunnel oxide layer comprises depositing the tunnel oxide layer on the substrate by using atomic layer epitaxy (ALE). A first gate is formed on the tunnel oxide layer. An insulator layer is formed on the first gate. The method further includes forming a second gate on the insulator layer.

According to another embodiment of the present invention, a method for fabricating a non volatile memory cell structure is provided. The method includes forming a first interface which has spaced source and drain regions and a body region located between the source and drain regions on a first portion of the first interface. To form the first interface, a self-structured mask is formed on the first portion of the first interface. The first portion of the first interface is etched to form a micro-roughened surface. The self-structured mask is removed. A tunnel oxide layer is deposited on the first portion of the first interface using atomic layer epitaxy (ALE). The method further includes forming a second interface adjacent to the first interface. A third interface is formed adjacent to the second interface. A fourth interface is formed adjacent to the third interface.

Thus, an improved structure and method for textured surfaces and insulating gate oxides in floating gate tunneling oxide (FLOTOX) devices are provided. The present invention capitalizes on using "self-structured masks" and a controlled etch to form nanometer scale microtip arrays in the textured surfaces. The microtips in the array of microtips have a more uniform size and shape and higher density (~$10^{12}/cm^2$) at the substrate/tunnel oxide ($Si/SiO_2$) interface than employed in the present FLOTOX technology. This higher density is four orders of magnitude greater than that which had been previously achieved. The new method and structure avoid smoothing the microtips arrays during the formation of the insulating gate oxide. In result, the new method and structure produce significantly larger tunneling currents for a given voltage than attained in prior FLOTOX transistors. The new method and structure are advantageously suited for the much higher density, non volatile FLOTOX transistors used in flash memories and in electronically eraseable and programmable read only memories (EEPROMs). These FLOTOX transistors are candidates for replacing the low power operation transistors found in DRAMs.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
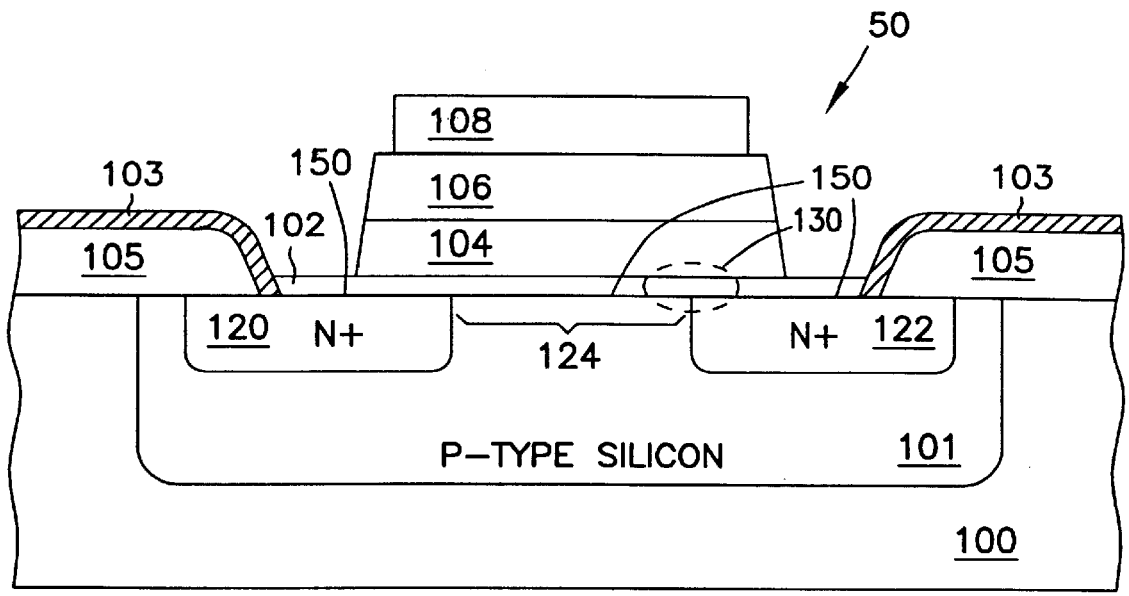
FIG. 1A is a cross-sectional view illustrating a non volatile floating gate tunneling oxide (FLOTOX) transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "upper," "side" (as in "sidewall"), "higher," "lower," "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n and p-type semiconductor materials, respectively.

FIG. 1A is a cross-sectional view illustrating a non volatile floating gate tunneling oxide (FLOTOX) transistor 50 according to the teachings of the present invention. The FLOTOX transistor 50 is a non volatile memory cell structure which has a floating gate 104 that can be electrically programmed, erased, and reprogrammed. Flash memory is one form of non volatile memory which implements floating gates. Electronically erasable and programmable read only memories (EEPROMs) are another form. Both types are recognized by those of ordinary skill in the art. FIG. 1A illustrates that FLOTOX transistor 50 includes a body region 101 as part of a substrate 100. Substrate 100 includes bulk semiconductor starting material, semiconductor-on-insulator (SOI) starting material, or SOI material that is formed from a bulk semiconductor starting material during processing. Using bulk silicon processing techniques, the body region 101 is single crystalline silicon (Si) which has been doped with a p-type dopant to form an p-type body region. In an alternative embodiment, the body region 101 is single crystalline silicon (Si) which has been doped with an n-type dopant to form an n-type body region. The FLOTOX transistor 50 includes a first source/drain region 120 and a second source/drain region 122 which are formed in the body region 101 portion of the substrate 100. The first and second source/drain regions, 120 and 122 are formed of single crystalline silicon (Si) that has been doped with an n-type dopant to form n+ first and second source/drain regions, 120 and 122. In an alternate embodiment, the first and second source/drain regions, 120 and 122, are formed of single crystalline silicon (Si) which has been doped with p-type dopant to form a p+first and second source/drain regions, 120 and 122. A channel region 124 is located in the body region 101 of the substrate 100 between the first and second source/drain regions, 120 and 122. The FLOTOX transistor 50 includes electrical contacts 103 which couple to the first and second source/drain regions, 120 and 122. Field oxide regions 105 define the boundary of the FLOTOX transistor 50 and serve to electrically isolate the FLOTOX transistor 50 from neighboring devices.

The FLOTOX transistor further includes a tunnel oxide layer 102 located on the substrate surface 150. The tunnel oxide layer 102 constitutes a first dielectric layer. The tunnel oxide layer is silicon dioxide ($SiO_2$) and covers the channel region 124 as well as portions of the first and second source/drain regions, 120 and 122 respectively. The location of the tunnel oxide layer 102 on the substrate surface 150 constitutes a first interface. A first gate 104 is located on the tunnel oxide layer 102. The first gate 104 is a first conductive layer and serves as the floating gate 104. In one embodiment, the first gate 104 is a polysilicon layer. The first gate 104 forms a second interface in combination with the tunnel oxide layer 102. An insulator layer 106 is positioned on top of the first gate 104. The insulator layer 106 constitutes a second dielectric layer. In one embodiment, the insulator layer 106 is a silicon dioxide ($SiO_2$) layer. The insulator layer 106 forms a third interface in combination with the first gate 104. A second gate 108 is further included in the FLOTOX transistor. The second gate 108 is a second conductive layer 108, which serves as a control gate 108. The second gate 108 is located on the insulator layer 106. The union between the second gate 108 and the insulator layer 106 forms a fourth interface. In one embodiment, the second gate 108 is a polysilicon layer.

Figure 1B:
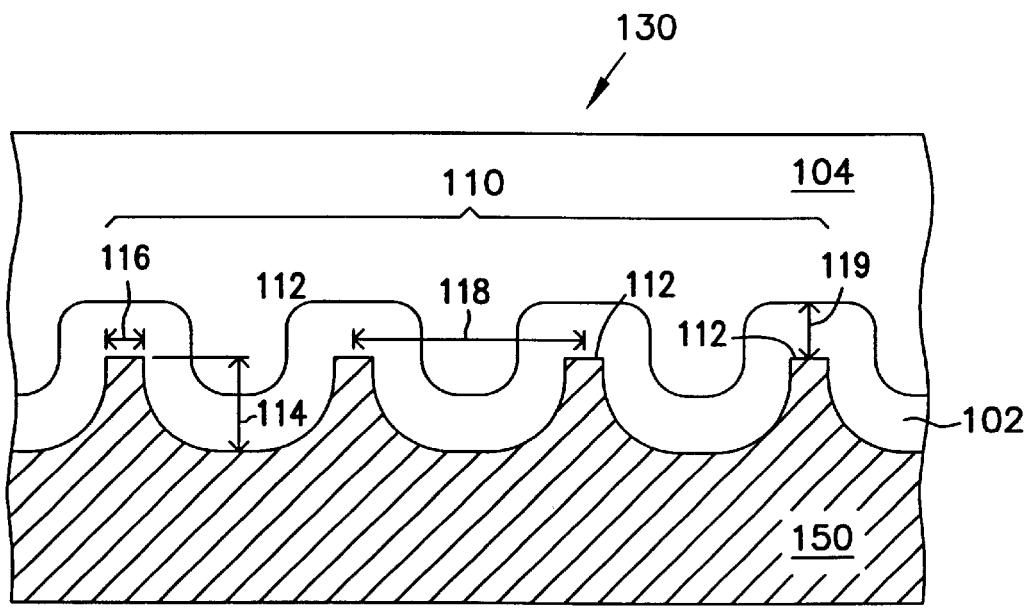
FIG. 1B is a cross-sectional view illustrating in greater detail an embodiment of an interface region for the FLOTOX transistor shown in FIG. 1A.

FIG. 1B is a cross-sectional view illustrating in greater detail an embodiment of an interface region 130 for the FLOTOX transistor shown in FIG. 1A. The interface region 130 depicted in FIG. 1B provides a sample representation of any region between the layered structure of the first gate 104, the tunnel oxide layer 102 and the substrate surface 150. FIG. 1B illustrates that the substrate surface 150 is textured. The substrate surface 150 includes an array of microtips 110. The array of microtips 110 consists of a multitude of asperities to the substrate surface 150. Each microtip has a top surface 112. In one embodiment, the microtips in array of microtips 110 have an average density of approximately $10^{12}$ microtips per square centimeter ($10^{12}/cm^2$) of substrate 100. In this embodiment, the microtips have an average height 114 of approximately 7 nanometers (nm). The top surfaces 112 of the microtips have an average diameter 116 of approximately 0.5 nm, and a center to center spacing 118 of the microtips which averages approximately 20 nm.

FIG. 1B's illustration of the interface region 130 further illustrates the tunnel oxide layer 102 covering the array of microtips 110. The tunnel oxide layer 102 on the array of microtips 110 provides a first interface. FIG. 1B further illustrates the first gate 104 located on the tunnel oxide layer 102. The junction between the first gate 104 and the tunnel oxide layer 102 provides a second interface.

Figure 2:
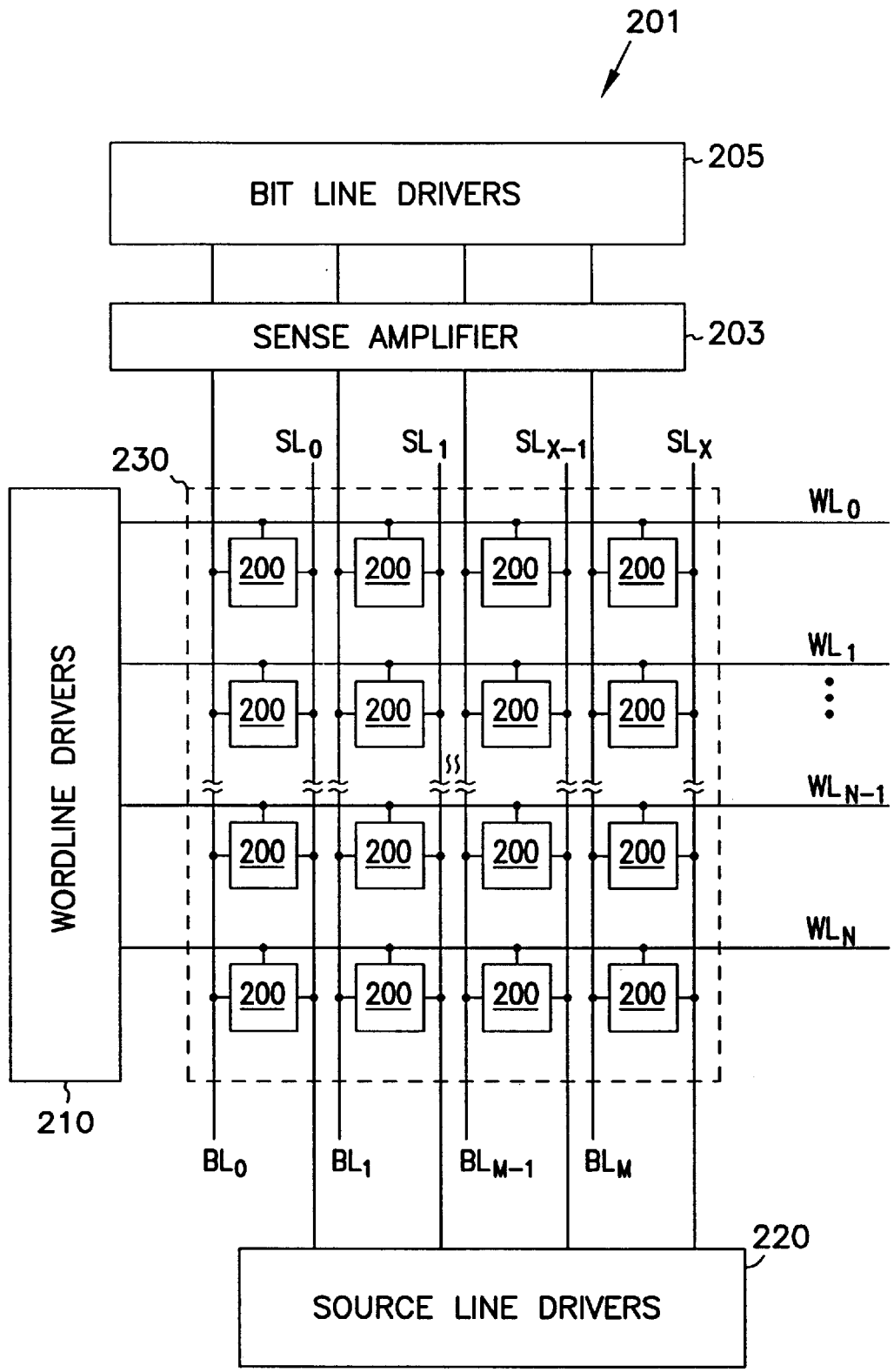
FIG. 2 is a block diagram illustrating an embodiment of a memory array according to the teachings of the present invention.

FIG. 2 is a block diagram illustrating an embodiment of a memory array 201 according to the teachings of the present invention. The memory array 201 is comprised of an array of non volatile memory cell structures 230 which includes a number of individual FLOTOX transistors 200. Each FLOTOX transistor 200 includes the non volatile memory cell structure described above in conjunction with FIGS. 1A and 1B. The memory array 230 includes a number of wordlines, a number of bitlines, and a number of sourcelines. In one embodiment, there are N rows wordlines $WL_0$, $WL_1$ ... $WL_{N-1}$, $WL_N$. Each of the N rows of wordlines couples the second conductive layer, or control gate, for a number of FLOTOX transistors 200 in the row. In analogous fashion, array 230 has M columns of bitlines $BL_0$, $BL_1$ ... $BL_{M-1}$, $BL_M$. Each of the M columns of bitlines couples the second source/drain region for a number of FLOTOX transistor 200 in the column. This embodiment further includes X columns of sourcelines $SL_0$, $SL_1$ ... $SL_{X-1}$, $SL_X$. Each of the X sourcelines couples the first source/drain region for a number of FLOTOX transistors 200 in the column. It should be noted the numbers represented by the variable X, M, and N may be the same or different.

The N rows wordlines $WL_0$, $WL_1$ ... $WL_{N-1}$, $WL_N$ are coupled to wordline drivers 210 and communicate with the control gates to selectively read, program, erase, or reprogram the FLOTOX transistors 200. The M columns of bitlines are coupled to a number of sense amplifiers 203 and serve to transport bits of data information to and from the number of FLOTOX transistors 200 of the memory array 201. A number of bitline drivers 205 are coupled to the number of sense amplifiers 203. The X columns of sourcelines $SL_0$, $SL_1$, ... $SL_{X-1}$, $SL_X$ are used to couple a power supply 220 ($V_{DD}$) to the number of FLOTOX transistors 200 in the memory array 201. The read, program and unprogram operations for a non volatile memory cell, of which flash memory is one form and EEPROMS are another, are well known by those of ordinary skill in the art. The actual steps in such processes do not form part of the present invention and thus are not recited in detail here.

Figure 3:
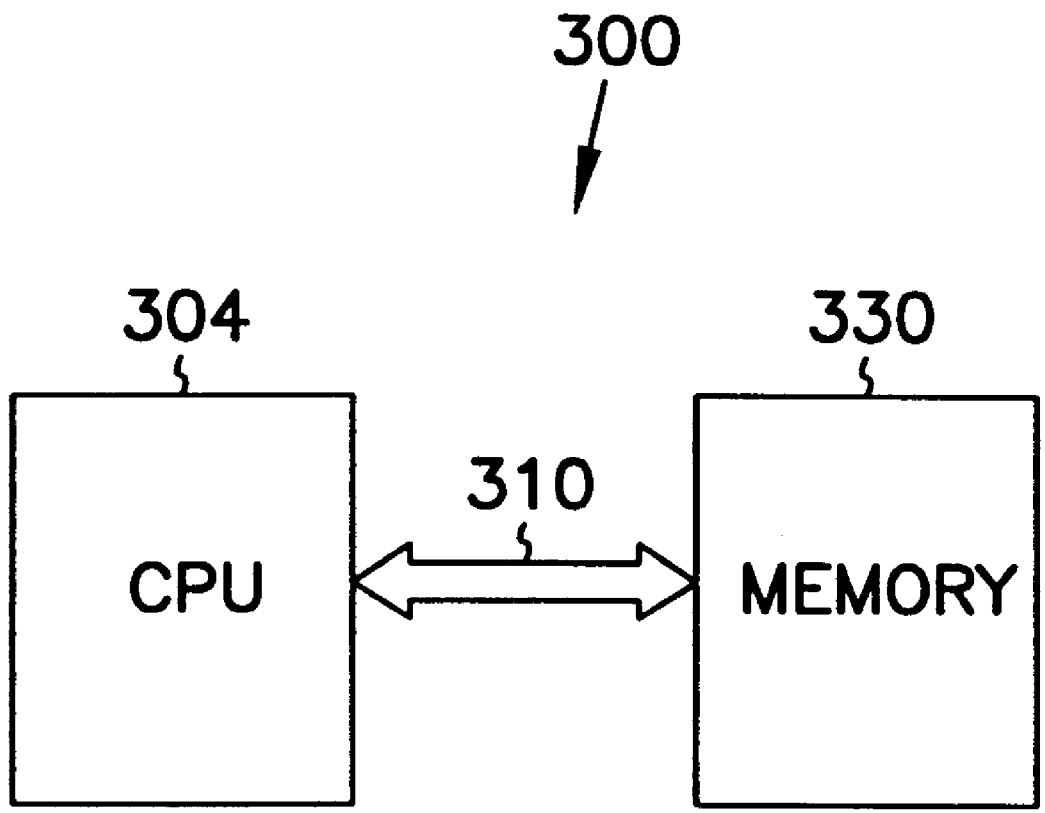
FIG. 3 is a block diagram illustrating an information handling system according to an embodiment of the present invention.

FIG. 3 is a block diagram illustrating an information handling system 300 according to an embodiment of the present invention. FIG. 3 illustrates that information handling system includes a memory 330. The memory includes the memory array provided and described above in connection with FIG. 2. The information handling system 300 further includes a central processing unit (CPU) 304. The CPU couples to the memory 330 via a system bus 310. CPUs 304 and system buses 310 are well known to those of ordinary skill in the art. These CPUs 304 and system buses 310 are commercially available in many suitable forms for implementation with the present invention. Those skilled in the art will recognize and be able to employ such suitable devices with the present invention. As such, a detailed of these CPUs 304 and system buses 310 is not provided here.

FIGS. 4A–4D illustrate an embodiment of a process of fabrication for a non volatile floating gate tunneling oxide (FLOTOX) transistor according to the teachings of the present invention. The standard FLOTOX transistor includes a source, a drain, and a body region all formed within a substrate. The body region separates the source and drain regions. These regions are covered by a tunnel dielectric. A floating gate is located on the tunnel dielectric. Further, a control gate is located on the floating gate. A second dielectric layer is interposed between and separates the control gate and the floating gate. Standard FLOTOX transistor formation, of this sort, is generally known by those of ordinary skill in the art. Therefore, for succinctness, FIGS. 4A–4D illustrate only the manner in which the substrate surface underneath, and then the tunnel oxide layer thereupon are structured without specific details as to how this region is mask defined or how other portions of the wafer are protected using standard materials and methods. The description relates to the substrate surface and the tunnel oxide layer structure in the body region as well as for portions of the first and second source/drain regions of the FLOTOX transistor.

Figure 4A:
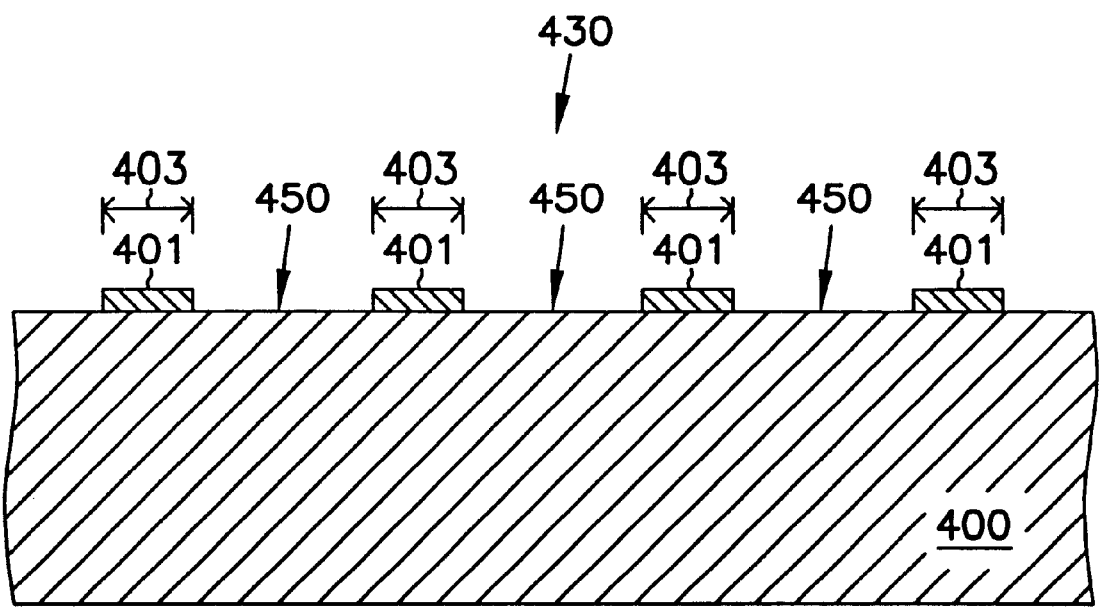
FIGS. 4A–4D illustrate an embodiment of a process of fabrication for a non volatile floating gate tunneling oxide (FLOTOX) transistor according to the teachings of the present invention.

FIG. 4A illustrates the structure after the following series of processing steps. The substrate surface 450 is cleaned using a wet etch of hydrofluoric acid (HF). In one embodiment, the substrate 400 is single crystalline silicon (Si) which has been doped with p-type dopant to form an p-type body region. In another embodiment, the substrate 400 is single crystalline silicon (Si) which has been doped with a n-type dopant to form a n-type body region. In yet another embodiment, the substrate 400 is single crystalline silicon (Si) which has been doped with an n-type dopant to form an n+ source/drain region. In still another embodiment, the substrate 400 is single crystalline silicon (Si) which has been doped with p-type dopant to form an p+ source/drain region.

A surface treatment 401 is applied to the surface 450 of the substrate 400. In one exemplary embodiment, the surface treatment 401 is a gold-palladium (AuPd) alloy which consist of a 6:4 combination ratio respectively. In an alternative embodiment, other suitable surface treatments 401 can be used. The AuPd surface treatment 401 is applied to the surface 450 of the substrate 400 by any suitable process such as, for example, by sputtering. The AuPd alloy is sputtered onto the surface using conventional techniques known by those of ordinary skill in the field of semiconductor fabrication. The AuPd alloy is sputtered on the substrate surface 450 to a thickness of approximately 0.4 nanometers (run). The sputtering process results in a surface treatment 401 of AuPd islands with diameters of approximately 2 nm on 20 nm centers creating a self structured mask.

Figure 4B:
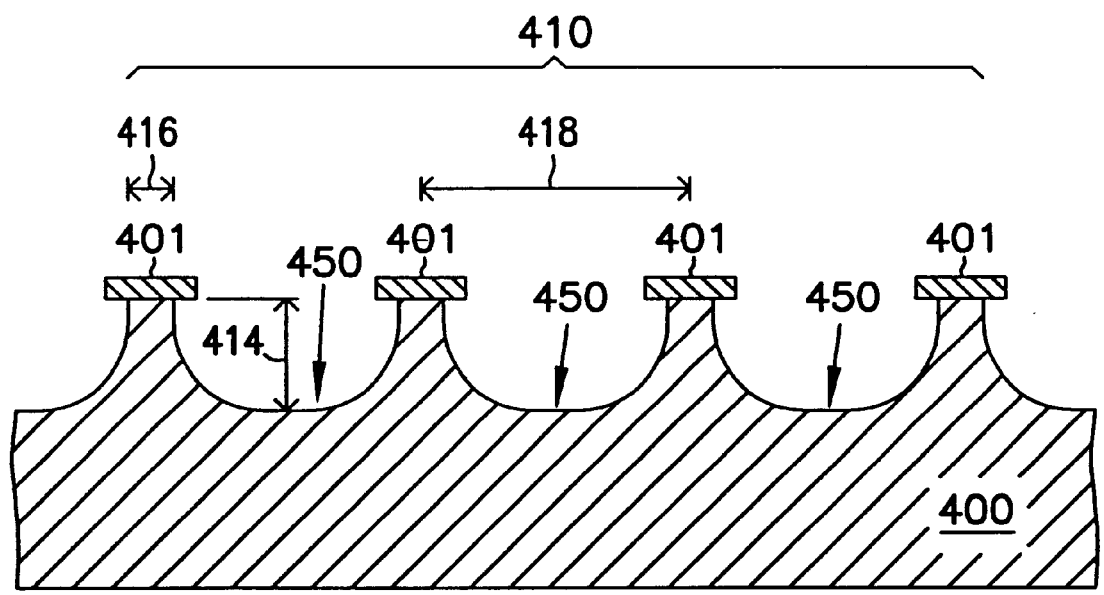

FIG. 4B illustrates the structure following the next series of processing steps. Next, in one embodiment, the substrate 400 is dry etched using reactive ion etching (RIE). The dry etch is performed using a sulfur hexafluoride ($SF_6$) gas. In an alternative embodiment, other compatible etching techniques can be utilized. The dry etch is performed in an rf cathode-coupled, parallel plate plasma etcher with temperature controlling electrodes which regulate the temperature of the substrate 400. Such systems can maintain the substrate 400 temperature range from −150 to +200 degrees Celsius (C). In one exemplary embodiment, the substrate temperature is maintained at −80 degrees Celsius. The rf power density in the RIE process is 0.2 Watts per cubic centimeter ($W/cm^3$) and the $SF_6$ gas pressure is kept at 8.6 Pascals (Pa). This process yields an etch rate of 400 nanometers per minute (nm/min). The substrate is etched for 1 second. The etch under these conditions produces an array of microtips

Figure 4C:
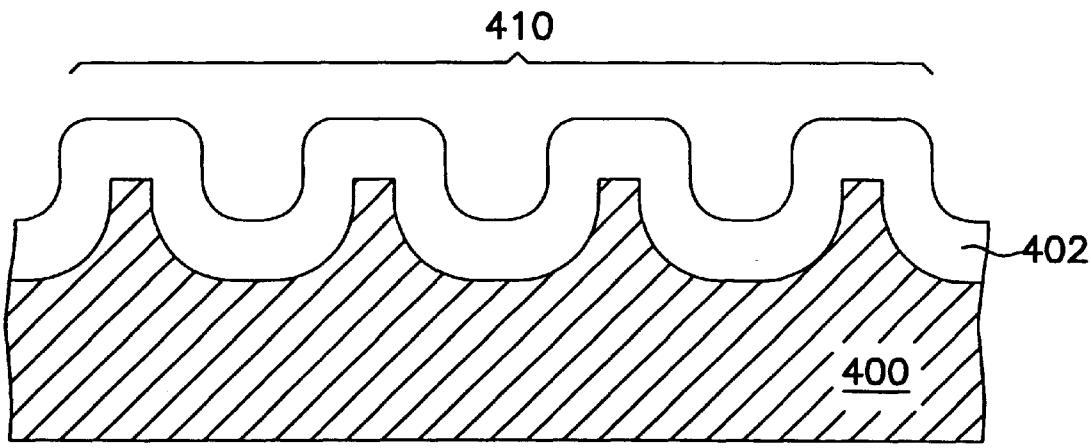
Figure 5:
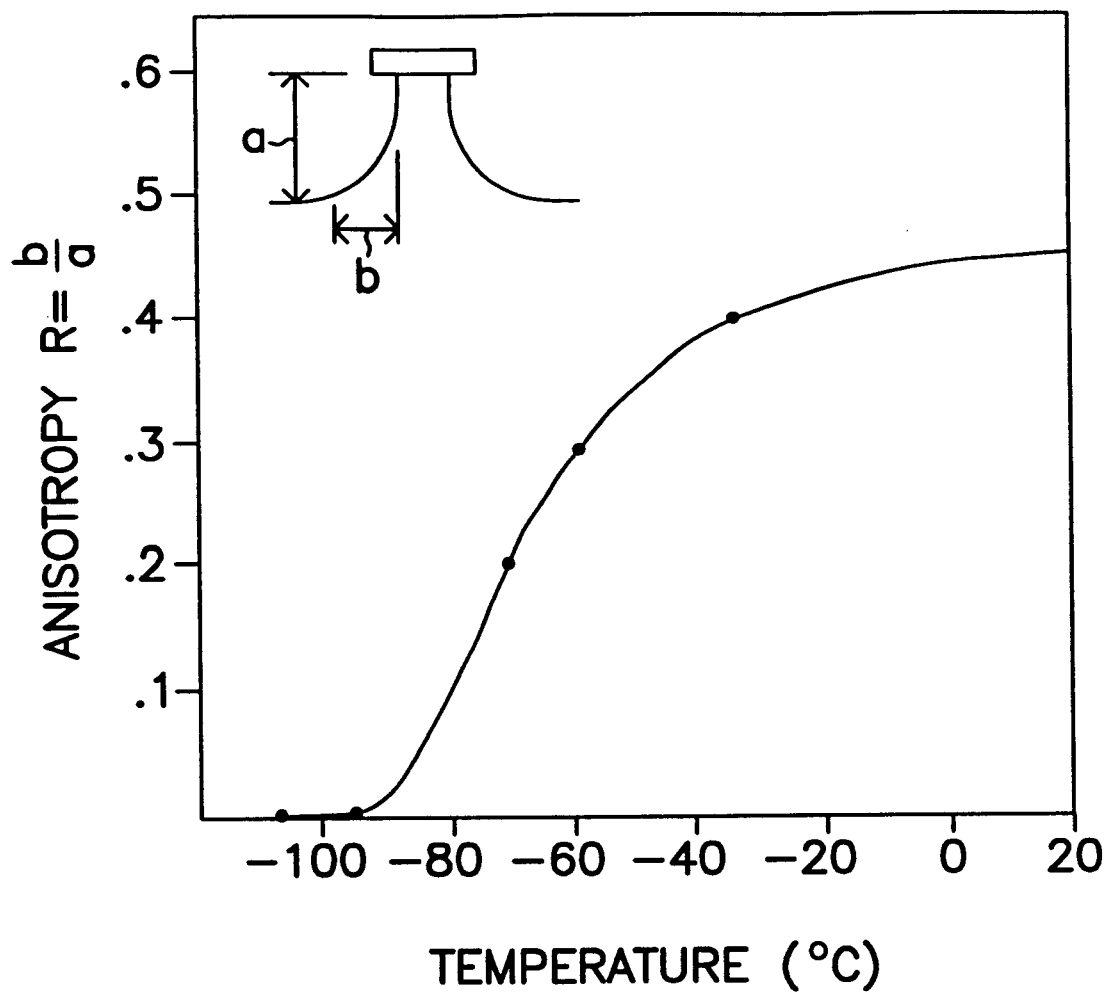
FIG. 5 is a graph illustrating the temperature dependence of anisotropy in a reactive ion etch (RIE) using a sulfur hexafluoride ($SF_6$) gas.

410. As illustrated in FIG. 4B, the microtips in the array of microtips 410 have an average height of 7 nm, a top surface diameter of 0.5 nm with a density of $10^{12}$ microtips per square centimeter ($10^{12}/cm^2$). In an alternative embodiment, the power density and/or $SF_6$ gas pressure can be reduced to allow for longer etch times. Similarly, other average heights and diameters for the microtips can be achieved by varying the substrate 400 temperature and etch times. FIG. 5 shows the anisotropic temperature dependence of $SF_6$ in a RIE under the conditions of the exemplary embodiment described above. FIG. 4C illustrates the structure after the next sequence of processing steps. The surface treatment 401 is removed using any suitable, conventional stripping technique. Such stripping techniques are well know by those practiced in the art of semiconductor fabrication. Next, an oxide layer 402 is formed across the array of microtips 410. The oxide layer 402 forms a first interface in combination with the array of microtips 410. The array of microtips constitutes a first portion of the first interface. In one embodiment, the oxide layer 402 is a $SiO_2$ layer 402 formed using atomic layer epitaxy (ALE). According to this method, atomic layer growth of Silicon dioxide ($SiO_2$) films is achieved by using binary reaction sequence chemistry. In one exemplary embodiment, a binary reaction sequence for the deposition of $SiO_2$ is:

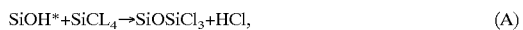

$$SiOH^* + SiCL_4 \rightarrow SiOSiCl_3 + HCl, \quad (A)$$

$$SiCl^* + H_2O \rightarrow SiOH^* + HCl, \quad (B)$$

where the surface species are indicated by the asterisks. Each half-reaction involves the reaction between a gas phase precursor and a surface functional group, e.g. SiOH* or SiCl*. Surface reaction continues until the initial surface functional groups are replaced by new ones. Once a half-reaction has reached completion, additional reactant exposure should produce no additional growth. In one embodiment the reaction is conducted in a temperature of $\geq 600$ degrees Kelvin (K). Under these conditions, a growth rate for the $SiO_2$ layer 402 is observed to be 1.1 Å per AB cycle. In one embodiment, the oxide layer 402 is deposited to a thickness between 15 and 100 Å. One of ordinary skill in the art of semiconductor fabrication will understand the binary reaction sequence chemistry. The principal advantage of the AB—AB type reaction is that the kinetics of the reaction should not affect the $SiO_2$ deposition.

The oxide layer 402 serves as the tunnel oxide layer 402 for the FLOTOX transistor. Thus, the tunnel oxide layer 402 is deposited to the appropriate thickness for the type of FLOTOX transistor desired. In example, if the FLOTOX is of the flash memory type, the oxide layer 402 will typically have a thickness of less than 150 Angstroms (Å). If, however, the FLOTOX is of the electronically erasable and programmable read only memory (EEPROM) type the oxide layer 402 will typically have a thickness of 150 Å or greater. The structure is now as is illustrated in FIG. 4C.

Figure 4D:
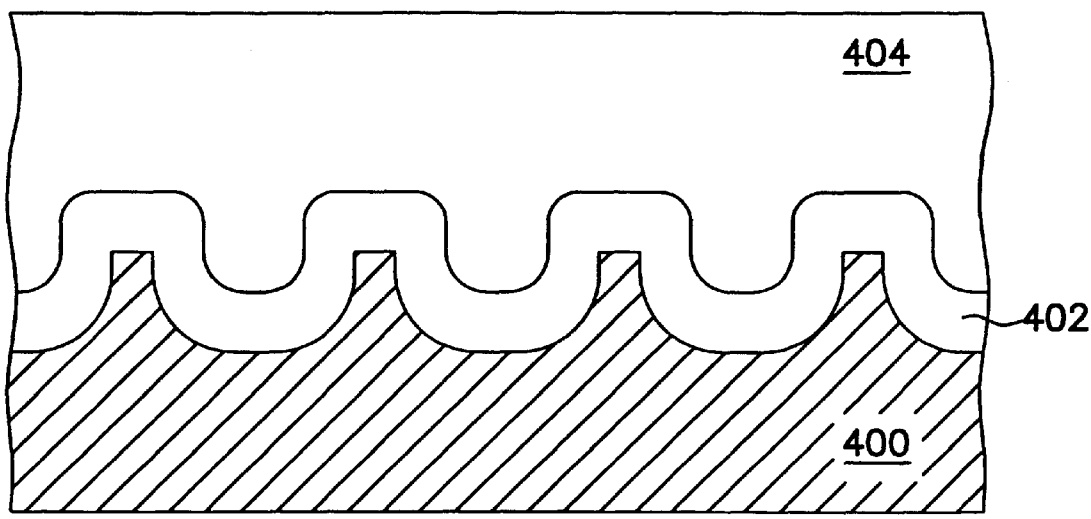

FIG. 4D illustrates the structure following the next sequence of processing steps. A first conductive layer 404 is formed on the oxide layer 402. The first conductive layer 404 is a first gate and serves as the floating gate in a FLOTOX transistor. The first conductive layer is formed using any suitable method such as, for example, chemical vapor deposition (CVD). In one embodiment, the first conductive layer 404 is polysilicon and forms a second interface in conjunction with the oxide layer 402. The structure is now as appears in FIG. 4D.

The remaining processing steps for completing the FLOTOX transistor follow conventional methods. These methods are well known by those practiced in the art of semiconductor fabrication. A second dielectric layer is formed on the floating gate and a second conductive layer, e.g., control gate, is formed on the second dielectric layer according to such conventional methods. The second dielectric layer and the control gate form a third and fourth interface, respectively, in the FLOTOX transistor. Contact holes and wiring for wordlines, bitlines, and sourcelines are achieved through conventional processing steps. One skilled in the art will recognize the method to these steps and, hence, they are not disclosed as part of this application.

Conclusion

A method and structure for textured surfaces and an improved floating gate oxide layer in floating gate tunneling oxide (FLOTOX) transistors are provided. The present invention capitalizes on using "self-structured masks" and a controlled etch to form nanometer scale microtip arrays in the textured surfaces. The present invention also employs atomic layer epitaxy (ALE) to create an a very conformal tunnel oxide layer which complements the nanometer scale microtip arrays. The resulting structure provides a higher tunneling current than currently exists in FLOTOX technology. The improved tunneling currents at low voltages can make these FLOTOX devices suitable for replacing DRAMS.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A information handling system, comprising:
   a memory array, wherein the memory array comprises:
      a number of floating gate tunneling oxide (FLOTOX) transistors, wherein each FLOTOX comprises:
         a substrate, the substrate having a first source/drain region, a second source/drain region, and a body region, the substrate having a textured surface, the textured surface including an array of microtips, each microtip having a top surface, and wherein the microtips have an average density of $10^{12}/cm^2$;
         a tunnel oxide layer formed on the textured surface of the substrate, wherein the tunnel oxide layer is deposited using atomic layer epitaxy (ALE);
         a first conductive layer formed on the tunnel dielectric;
         an insulator layer formed on the first conductive layer; and
         a second conductive layer formed on the insulator layer;
      a number of wordlines, wherein each wordline couples the second conductive layer for a number of FLOTOX transistors;
      a number of bitlines, wherein each bitline couples the second source/drain region for a number of FLOTOX transistors;
      a number of sense amplifiers, wherein each sense amplifier couples to select number of the number of bitlines; and a number of sourcelines, wherein each sourceline couples a first source/drain region for a number of FLOTOX transistors;

a central processing unit; and a system bus, wherein the system bus couples the memory array to the central processing unit.

2. The information handling system of claim 1, wherein the tunnel oxide layer includes a thickness between 15 and 100 Angstroms (Å).

3. The information handling system of claim 1, wherein the number of floating gate tunneling oxide (FLOTOX) transistors includes a number of flash memory cells.

4. The information handling system of claim 1, wherein the number of floating gate tunneling oxide (FLOTOX) transistors includes a number of electronically eraseable and programmable read only memories (EEPROMs).

5. The information handling system of claim 1, wherein the first conductive layer is a floating gate.

6. The information handling system of claim 1, wherein the second conductive layer is a control gate.

7. The information handling system of claim 1, wherein the microtips in the array of microtips have an average height of 7 nanometers (nm), the microtips have an average diameter at the top surface of 0.5 nm.

8. A information handling system, comprising:

a memory array, wherein the memory array comprises:

a number of floating gate tunneling oxide (FLOTOX) transistors, wherein each FLOTOX comprises:

a first interface having a first and second source/drain region and a body region therebetween on a first portion of the first interface, wherein the first portion includes a surface having an array of asperities, each asperity having a top surface, the asperities in the array of asperities having an average density of $10^{12}/cm^2$, the first interface having a first dielectric as a second portion of the first interface;

a second interface adjacent to the first interface;

a third interface adjacent to the second interface; and a fourth interface adjacent to the third interface;

a number of wordlines, wherein each wordline couples the fourth interface for a number of FLOTOX transistors;

a number of bitlines, wherein each bitline couples the second source/drain region for a number of FLOTOX transistors;

a number of sense amplifiers, wherein each sense amplifier couples to a select number of the number of bitlines; and a number of sourcelines, wherein each sourceline couples the first source/drain region for a number of FLOTOX transistors;

a central processing unit; and a system bus, wherein the system bus couples the memory array to the central processing unit.

9. The information handling system of claim 8, wherein the second interface comprises a first dielectric/polysilicon interface.

10. The information handling system of claim 8 wherein a distance between the first interface and the second interface is between 15 and 100 Angstroms (Å).

11. The information handling system of claim 8, wherein the third interface comprises a polysilicon/second dielectric interface.

12. A information handling system, comprising:

a memory array, wherein the memory array comprises:

a number of floating gate tunneling oxide (FLOTOX) transistors, wherein each FLOTOX comprises:

a first interface having a first and second source/drain region and a body region therebetween on a first portion of the first interface, wherein the first portion includes a surface having an array of asperities, each asperity having a top surface, the asperities in the array of asperities having an average density of $10^{12}/cm^2$, the first interface having a first dielectric as a second portion of the first interface;

a first dielectric/polysilicon interface adjacent to the first interface;

a polysilicon/second dielectric interface adjacent to the first dielectric/polysilicon interface; and a second dielectric/polysilicon interface adjacent to the polysilicon/second dielectric interface;

a number of wordlines, wherein each wordline couples the second dielectric/polysilicon interface for a number of FLOTOX transistors;

a number of bitlines, wherein each bitline couples the second source/drain region for a number of FLOTOX transistors;

a number of sense amplifiers, wherein each sense amplifier couples to a select number of the number of bitlines; and a number of sourcelines, wherein each sourceline couples the first source/drain region for a number of FLOTOX transistors;

a central processing unit; and a system bus, wherein the system bus couples the memory array to the central processing unit.

13. The information handling system of claim 12, wherein the first dielectric/polysilicon interface comprises a floating gate region.

14. The information handling system of claim 12, wherein the second dielectric/polysilicon interface comprises a control gate region.

15. The information handling system of claim 12, wherein the asperities in the array of asperities have an average height of 7 nanometers (nm), the asperities have an average diameter at the top surface of 0.5 nm.

16. The information handling system of claim 12, wherein the number of floating gate tunneling oxide (FLOTOX) transistors includes a number of flash memory cells.

17. The information handling system of claim 12, wherein the number of floating gate tunneling oxide (FLOTOX) transistors includes a number of electronically erasable and programmable read only memories (EEPROMs).

* * * * *

UNITED STATES PATENT AND TRADEMARK OFFICE
CERTIFICATE OF CORRECTION

PATENT NO. : 6,294,813 B1
DATED : September 25, 2001
INVENTOR(S) : Leonard Forbes and Joseph E. Geusic Page 1 of 1

It is certified that error appears in the above-identified patent and that said Letters Patent is hereby corrected as shown below:

<u>Title page, Item [54] and Column 1, lines 1-3,</u>
In the title, delete "INFORMATION HANDLING SYSTEM HAVING IMPROVED FLOATING GATE TUNNELING DEVICES" and insert -- ALTERNATE METHOD AND STRUCTURE FOR IMPROVED FLOATING GATE TUNELING DEVICES --, therefor.

<u>Column 7,</u>
Line 34, delete "$wl_n$" and insert -- $WL_n$ --, therefor.

Signed and Sealed this

Twenty-eighth Day of May, 2002

Attest:

JAMES E. ROGAN
*Attesting Officer*  *Director of the United States Patent and Trademark Office*